WIRE WOUND CRYOGENIC DEVICE

Filed Aug. 5, 1965

INVENTOR.
EDWIN S. LEE, III
BY
Christie, Parker & Hale
ATTORNEYS.

3,327,273

WIRE WOUND CRYOGENIC DEVICE

Edwin S. Lee III, Claremont, Calif., assignor to Burroughs Corporation, Detroit, Mich., a corporation of Michigan Filed Aug. 5, 1965, Ser. No. 477,542
6 Claims. (Cl. 338—32)

This invention relates to electrical circuit elements and, more particularly, to superconducting circuit elements such as cryotrons.

The cryotron utilizes the superconductive characteristics displayed by certain materials when held under conditions of very low temperature. In the absence of a magnetic field, certain materials will change from a resistive state to a superconducting state, in which their electrical resistance is zero, as their temperature is reduced below a certain critical temperature. A magnetic field applied to such materials lowers the temperatures at which the transition from a resistive to a superconducting state occurs and the critical temperature becomes a function of the magnetic field applied. Moreover, if a superconducting material is held at a constant temperature, changes in the density of a magnetic field applied thereto may be utilized to cause the superconducting material to enter the resistive or normal state.

The earliest cryotrons generally consisted of nothing more than a first straight wire having a number of turns of a second wire wound around it. Insulation between the two wires prevented electrical contact. A current in the second wire, or control element, was utilized to create a magnetic field which determined whether the first wire, or gate element, would be in a superconducting or resistive state. Such cryotrons are described for example, in Richards, Digital Computer Components and Circuits, D. Van Nostrand Co., 1957, pp. 428–437.

Thin film cryotrons have also been developed which may comprise an evaporated gate element and an evaporated control element separated by an evaporated film of insulating material all of which are deposited on the flat surface of a substrate of glass or other insulating material. The entire cryotron is immersed in a medium, such as, for example, liquid helium, sufficient to obtain the low temperature necessary to render both the gate element and control element superconducting. A current passed through the control element is utilized to create a magnetic field which in turn controls the resistivity of the gate element.

The cryotron is generally used as a switch having two positions. One position being the zero resistance or superconducting state of the gate element and the other position being the resistive state. If a current of sufficient magnitude is applied to the control element, the magnetic field produced thereby will cause the gate to switch from the superconducting position to the resistive position. Thus, the control and gate elements from an electrically operated switch which can be changed from a superconductive to a resistive state by the application of current to the control.

Previously, cryotrons having a variable gate resistance were only obtainable by applying a fixed biasing magnetic field to the gate to bias the gate between the superconducting and resistive states. The biasing field is chosen such that the gate is not superconducting but is insufficient to cause the gate to enter the resistive or normal state. Slight variations in the current passing through the control element may then be used to vary the magnetic field applied to the gate, thereby varying the resistance of the gate. In this type of operation, however, the gate is extremely sensitive to slight changes in the applied magnetic field and to small current variations in the control. Additionally, it is difficult to maintain the fixed biasing magnetic field. Furthermore, the useful variation of gate resistance obtained in this manner is very small.

These and other problems with respect to cryotrons having variable gate resistance are eliminated by the novel thin film cryotrons disclosed in Patent No. 3,283,282 of Harvey Rosenberg and the present applicacant filed on May 28, 1962 and assigned to the assignee of the present invention. The thin film cryotrons disclosed in the aforesaid patent provide devices wherein the resistance of the gate is a function of the control current, the geometry of the control element, and, if desired, a function of the geometry of the gate element. By using various geometric shapes for the thin film gate and/or the thin film control, the gate resistance is easily varied over a wide range. Many desirable functional relationships between the gate resistance and control current may thereby be achieved by means of thin film control elements and thin film gate elements of particular predemined geometric shapes. Moreover, thin film cryotrons according to the invention disclosed in the aforesaid patent may be designed to have two control elements of different predetermined geometric shapes positioned on opposite sides of the gate element.

While thin film cryotrons may easily be designed to have control and/or gate elements of particular predetermined geometric shapes, wire wound cryotrons by their very nature are not easily adaptable to such design techinques.

Accordingly, an advantage realized by the present invention is the provision of a wire wound cryogenic device which also overcomes the previously described disadvantages of prior art cryotrons having variable gate resistances.

These advantages are achieved by means of a wire wound cryotron in which the control element applies different predetermined values of magnetic field to various portions of the gate element. Such differing magnetic fields may advantageously be applied to the gate element by means of a single control winding in which the pitch of the winding varies from one end of the gate element to the other. As a result, different magnetic fields will be generated at one end of the gate element than at its other end. The variations in magnetic field applied to the gate element may be controlled by means of predetermined variations in pitch of the control winding along the gate element. Alternatively, several concentric control windings may be utilized to apply differing magnetic fields along the length of a single gate element. Thus, portions of the gate may be subjected to a magnetic field produced by a single winding while other portions of the gate are subjected to a magnetic field produced by several windings. Additionally, the gate element may be designed to have, when in its resistive state, a resistivity which varies along the length of the element. The application of different magnetic fields to different parts of the gate element, and utilization of a gate element having a varying resistivity along its length enables the provision of a wire wound cryogenic device in which gate resistance may be made to vary with control current in accordance with many predetermined functional relationships. Thus, the present invention provides a wire wound cryotron which may be designed to produce many desirable predetermined functional relationships between the gate resistance and control current.

The manner of operation of the present invention and the manner in which it achieves the above and other advantages may be more clearly understood by reference to the following detailed description when considered with the drawing, in which.

Figure 2:
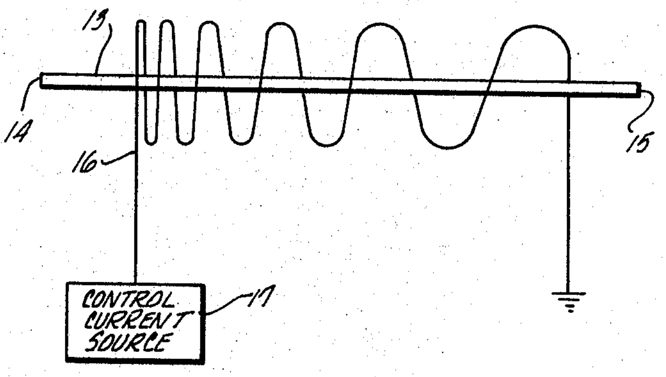
FIG. 2 depicts a wire wound cryogenic element according to the present invention in which different predetermined values of magnetic field are applied to various portions of a gate element by means of a single control element wound about the gate element and having a pitch which varies from one end of the gate element to the other.
Figure 3:
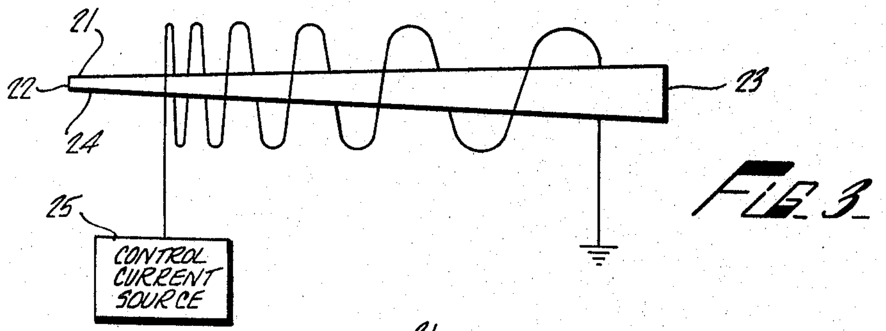
Figure 4:
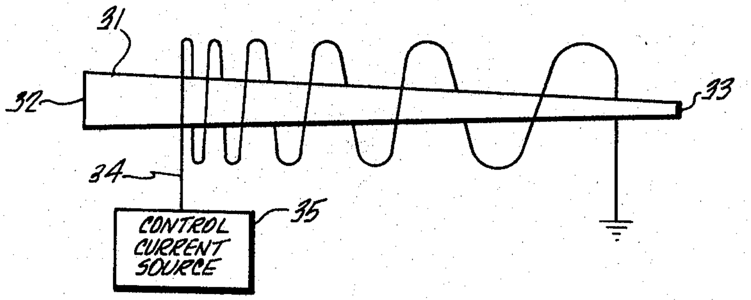
Figure 5:
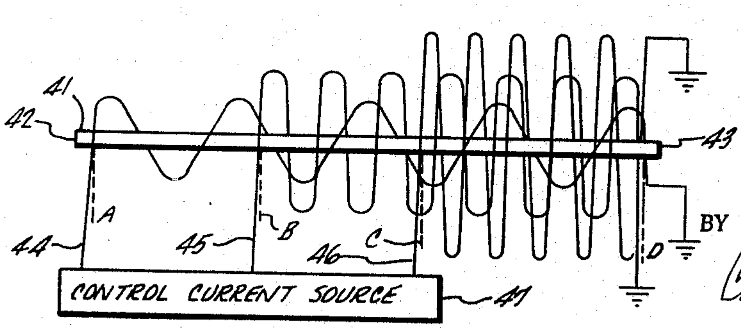

FIGS. 3 and 4 depict a wire wound cryogenic element as shown in FIG. 2 also having a gate element whose resistivity while in the resistive state varies along the length of the element, increasing with increase in control element pitch in FIG. 3 and decreasing with increase in control element pitch in FIG. 4; and FIG. 5 depicts a wire wound cryogenic element according to the present invention in which different predetermined values of magnetic field are applied to various positions of a gate element by means of several concentric control elements wound about the gate element such that various portions of the gate element are coupled to different combinations of the control elements.

Figure 1:
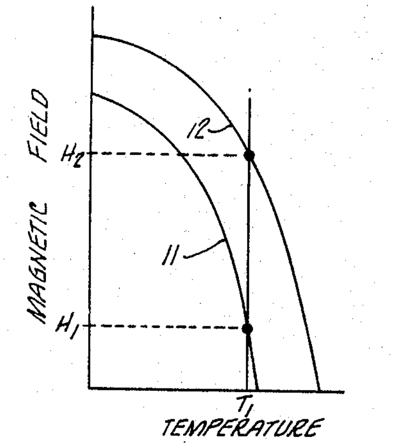
FIG. 1 depicts the relationship between the resistive-superconductive transition temperature and applied magnetic field for two illustrative superconductive materials.

FIG. 1 depicts the relationship between the resistive-superconductive transition points as a function of applied temperature and magnetic field for two illustrative superconductive materials. Thus, the region bounded by the magnetic field axis, temperature axis and the curve 11 represents the superconductive region of an illustrative first material while the area outside of this region represents the normal resistive condition of this material. Similarly, the area bounded by the magnetic field axis, temperature axis and curve 12 represents the superconductive state of a second illustrative material while the area outside of this region represents the normal resistive state of this material. Thus, it may be seen that for a given magnetic field applied to both of these materials they will have different transition temperatures, each material being superconductive when its temperature falls below its transition temperature and being in the normal resistive state when its temperature rises above its transition temperature.

Similarly, if both materials are held at an identical temperature, each of them will be caused to switch between the normal and superconductive state by different values of a magnetic field applied thereto. Thus, in FIG. 1, if the materials represented by curves 11 and 12 are maintained at the temperature $T_1$ and no magnetic field is applied thereto, both materials will be in the superconductive state. A magnetic field $H_1$ will be sufficient to drive the first material to its transition point and any field larger than $H_1$ will switch this material into its normal resistive state. The second material, however, will not be driven to its transition point by any magnetic field of a value smaller than $H_2$, as shown in FIG. 1. An applied magnetic field at a value greater than $H_2$ will, however, be sufficient to switch this material into its normal resistive state. Thus, as shown in FIG. 1, any magnetic field of a value between $H_1$ and $H_2$ will be sufficient to switch the first material to its normal resistive state but insufficient to switch the second material to its normal resistive state.

In cryotrons its is normally advantageous that signals applied to a superconductive control element be able to switch a superconductive gate element between its superconductive state and its normal resistive state, without switching the control element from its superconductive state. Thus, a material manifesting the characteristics of curve 11 would be utilized as the gate element while a material manifesting the characteristics of curve 12 would be utilized as the control element.

In the present invention, as described hereinafter, different values of magnetic field are applied to separate portions of the gate element. It is advantageous, however, that none of these different values of field exceed a value $H_2$. Thus for two superconductive materials, such as those represented by curves 11 and 12 in FIG. 1, utilized in the present invention it will be advantageous to select an operating temperature $T_1$ such that the difference between the two critical fields $H_1$ and $H_2$ is made to be relatively large. Examples of particular superconductive materials which have been previously used successfully in cryogenic devices and which could also be used in the present invention are, for example, tantalum for the gate element and niobium for the control element, or, as an alternative example, tin for the gate element and lead for the control element.

FIG. 2 depicts a wire wound cryogenic device according to the present invention in which gate element 13, having an input terminal 14 and an output terminal 15, is a wire of superconductive material with characteristics as manifested by curve 11 of FIG. 1. Control element 16 is a wire of superconductive material with characteristics as manifested by the curve 12 of FIG. 1 as is shown to be helically wound about gate element 13 and connected between a ground reference potential and a control current source 17. Source 17 is shown in block diagram form and may represent any well known circuit capable of providing predetermined values of electrical current to control element 16.

The number of turns of control element 16 wound about successive unitary lengths of gate element 13 is shown to vary along the length of element 13, this variation being a linear one in the circuit of FIG. 2. The variation in the number of turns per unit length, or pitch, of the winding 16 will cause the control current applied to winding 16 from source 17 to generate a magnetic field which varies along the length of element 13 in accordance with the variation in pitch of element 16 along the length of element 13. This results since the magnetic field produced by winding 16 at any point along the length of gate element 13 is not only directly proportional to the control current passing through element 16 but is also directly proportional to the pitch of control element 16 at the particular point. Thus, as the control current increases from a zero value the critical field $H_1$ for gate 13 will first be reached at the left end of gate 13 as viewed in FIG. 2. If the control current is gradually increased, a gradual switching of element 13 to its resistive state will continue until the right end portion of element 13, as viewed in FIG. 2, has a field equal to $H_1$ applied thereto at which time the entire gate element will have been switched to its normal resistive state.

For the value of current sufficient to switch the entire control element to its resistive state, it is advantageous that the control element 16 not be switched to its normal resistive state. Thus, when the right end portion of control element 16, as viewed in FIG. 2, produces a value of magnetic field just sufficient to switch the portion of the gate element coupled thereto, it is desirable that the maximum field produced by the left end portion of element 16 be less than $H_2$, as shown in FIG. 1. This relationship between the fields produced at the two ends of the gate element may be achieved by a proper selection of gate and control element materials, operating temperature, and the maximum-to-minimum pitch ratio of control element 16.

It is clear that the resistance of gate 13 is a linear function of the control current applied to control 16 from source 17. Thus, the resistance of gate 13 can be varied over a wide range simply by varying the control current supplied by source 17. This linear relationship between the resistance of gate 13 and the current supplied from source 17 results from the linear variation in pitch of the control element 16 wound about the gate 13. Similarly, other functions between the resistance of gate 13 and the current applied to source 17 could be achieved by varying the pitch of control element 16 in accordance with such other functions.

The novel cryogenic device depicted in FIG. 2 can perform certain functions unobtainable by prior art wire wound cryotron devices in a manner similar to the functions performed by the thin film cryotrons disclosed in the copending application referred to previously. Thus, it may be utilized to give an analog output voltage by applying a fixed value of measuring current to the gate 13. Since the resistance between terminals 14 and 15 will be proportional to the control current passing through element 16, a voltage drop measured between terminals 14 and 15 will be proportional to the current flowing through element 16.

Similarly, the circuit of FIG. 2 may be utilized as an amplifier having no phase inversion of the input signal since a varying control current passing through element 16 will be faithfully reproduced without phase shift as a varying voltage between terminals 14 and 15.

For illustrative purposes, means for electrically insulating gate 13 and control 16 are not shown. Similarly, the winding of control 16 about gate 13 is shown in an exaggerated manner. Control element 16 may advantageously be wrapped much more tightly around gate 13 than shown in FIG. 2.

FIG. 3 depicts a wire wound cryogenic device according to the principles of the present invention wherein a gate element 21, which may again be of a superconductive material manifested by the curve 11 of FIG. 1, is shown to have a diameter which varies linearly between input terminal 22 and output terminal 23. As a result, the cross-sectional area of element 21 and consequently its resistivity when in the normal resistive state, will vary along its length. Control element 24 wound about gate element 21 and connected between ground potential and control current source 25 is identical to element 16 of FIG. 2. Similarly, source 25 is identical to source 17 of FIG. 2. It may be seen from FIG. 3 that a linear increase in current supplied by source 25 will, for this device, not produce a linear increase in resistance between terminals 22 and 23. This results because of the variation in resistivity along the length of element 21.

The resistivity at the left end of element 21, as viewed in FIG. 3, will be greater than that at its right end since the left end has a smaller cross-sectional area. Since the change in pitch of element 24 along the length of element 21 is again assumed to be linear, the length of gate 21 switched to a resistive state by a current from source 25 will increase linearly with this current. However, the resistance of a unit length of element 21 at the left end of this element will be greater than the resistance of a unit length at its right end. Thus, the circuit of FIG. 3 may be utilized to develop additional functional relationships between the resistance developed between terminals 22 and 23, and the control current applied from source 25.

FIG. 4 depicts another embodiment of the present invention wherein gate element 31 is shown to have a diameter which decreases from input terminal 32 to output terminal 33. The gate 31 may also be assumed to be of a material having characteristics as manifested by curve 11 of FIG. 1. Control element 34 is shown to be wound about element 31 and connected between ground potential and control current source 35. Control element 34 and current source 35 are identical with control element 16 and current source 17 of FIG. 2, respectively.

In FIG. 4, the resistivity of element 31 increases with decreasing pitch of the winding 34. This distinguishes it from the circuit of FIG. 3 wherein the pitch of winding 24 increases with increase of resistivity. Thus, the embodiment of FIG. 4 may be utilized to develop further additional functional relationships between the resistance developed between terminals 32 and 33 and the control current supplied from source 35.

Finally, FIG. 5 depicts another embodiment of the present invention in which the gate element 41 having an input terminal 42 and an output terminal 43 may again be considered to be of a material represented by the curve 11 of FIG. 1. The gate element 41 is identical to the gate element 13 shown in FIG. 2. The device shown in FIG. 5, however, has three control elements 44, 45, and 46 wound about gate element 41 connected between ground potential and a source of control current 47. Each of the control windings 44, 45, and 46 may be considered to be of a material represented by the curve 12 shown in FIG. 1. Each of the windings 44, 45, and 46 is also shown to be wound at a constant pitch along the length of element 41. Each of these control elements, however, is shown to be wound along different portions of the element 41. Thus, the control element 44 is wound along the length of gate element 41, from point A to point D; the control element 45 is wound about a smaller length of element 41, from point B to approximately point D; and the control element 46 is wound about a still smaller length of gate element 41, from point C to approximately point D. In order to distinguish the three windings shown in FIG. 5, they have been shown in an exaggerated manner. The current control source 47 is shown in block diagram form and may represent any well known circuit capable of selectively applying control currents of predetermined values to the control elements 44, 45, and 46.

Assuming control currents of equal value applied to the three control elements 44, 45, and 46, it may be seen that the fields applied to the gate element 41 as a result thereof are equivalent to the fields which would be applied thereto by a current applied to a single control element if such control element were wound about element 41 in accordance with a first pitch between points A and B, in accordance with a second pitch greater than the first between points B and C, and in accordance with a third pitch greater than the second between points C and D. This results since the length of gate 41 between points A and B has the single element 44 wound thereabout, the length between points B and C has the two elements 44 and 45 wound thereabout, and the length between points C and D has all three elements 44, 45, and 46 wound thereabout.

It may be seen that in a device following the pattern shown in FIG. 5 in which a sufficient number of control elements are utilized, having equal values of control current applied to each, the resulting circuit approaches an equivalent circuit having a single control element with linearly varying pitch such as that shown in FIG. 2. The arrangement shown in FIG. 5, however, may be seen to enjoy a certain flexibility over that in FIG. 2 in that the values of magnetic field applied along the length of gate 41 may also be controlled by different values of current selectively applied to the elements 44, 45, and 46 from source 47. As a result, the arrangement of FIG. 5 may develop functional relationships between a value of resistance developed between terminals 42 and 43 and the control currents applied to elements 44, 45, and 46.

The foregoing circuits may be utilized to develop many functional relationships between the resistance of a superconductive gate element and currents applied to superconductive control elements in a manner similar to that described in the copending application referred to previously in which discussion was directed toward thin film cryogenic devices.

What have been described are considered to be only illustrative embodiments of the present invention and, accordingly, it is to be understood that various and numerous other arrangements may be devised by one skilled in the art without departing from the spirit and scope of this invention.

What is claimed is:

1. A cryogenic element comprising:

a superconductive gate means having an input and an output, an active length of the gate means extending between the input and the output, a first predetermined magnetic flux density applied to the gate means being sufficient to switch the gate means from a superconductive to a resistive condition, the resistivity of the gate means when in the resistive condition varying along the active length of the gate means, and control means helically wound about the gate means in insulating relationship therewith and magnetically coupled thereto for selectively applying a flux density greater than the first predetermined magnetic flux density to any one of a plurality of lengths measured along the active length of the gate means.

2. A cryogenic element according to claim 1 in which the pitch of the control means wound about the gate means varies along the length of the gate means.

3. A cryogenic element according to claim 2 in which the resistivity of the gate means when in the resistive condition varies in accordance with a predetermined geometric relationship along the active length of the gate means.

4. A cryogenic element according to claim 3 in which the active length of the gate means is tapered such that its cross-sectional area increases from the input to the output.

5. A cryogenic element according to claim 3 in which the active length of the gate means is tapered such that its cross-sectional area decreases from the input to the output.

6. A cryogenic element comprising:

a superconductive gate means having an input and an output, an active length of the gate means extending between the input and the output, a first predetermined value of magnetic flux density applied to the gate means being sufficient to switch the gate means from a superconductive to a resistive condition.

a plurality of superconductive control windings helically wound about the gate means in insulating relationship therewith and magnetically coupled thereto, a first winding coupled to a first discrete portion of the gate means along the active length of the gate means, a second winding coupled to a second discrete portion along the length of the first discrete portion, and a third winding coupled to a third discrete portion along the length of the second discrete portion, and means for selectively passing current through the control windings sufficient to apply a magnetic flux density greater than the first predetermined value of flux density to a predetermined one of the discrete portions of the gate means.

References Cited

UNITED STATES PATENTS

| | | | |
|---|---|---|---|
| Re. 25,712 | 1/1965 | Slade | 340—173.1 |
| 2,914,736 | 11/1959 | Young | 307—88.5 |
| 2,989,714 | 6/1961 | Park et al. | 338—32 |
| 3,015,041 | 12/1961 | Young | 307—88.5 |
| 3,049,686 | 8/1962 | Walters | 338—32 |
| 3,061,738 | 10/1962 | Wilson | 340—173.1 |
| 3,093,748 | 6/1963 | Anderson | 340—173.1 |
| 3,119,986 | 1/1964 | Fowler | 338—32 |
| 3,162,775 | 12/1964 | McFerran | 307—88.5 |
| 3,168,727 | 2/1965 | Schmidlin et al. | 338—32 |
| 3,239,683 | 3/1966 | Anderson | 340—173.1 |

RICHARD M. WOOD, *Primary Examiner.*

W. D. BROOKS, *Assistant Examiner.*